United States Patent
Park et al.

(10) Patent No.: US 8,569,764 B2
(45) Date of Patent: Oct. 29, 2013

(54) THIN FILM TRANSISTOR, METHOD OF FABRICATING THE SAME, AND ORGANIC LIGHT EMITTING DIODE DISPLAY DEVICE INCLUDING THE SAME

(75) Inventors: Byoung-Keon Park, Suwon-si (KR);
Tae-hoon Yang, Suwon-si (KR);
Jin-Wook Seo, Suwon-si (KR);
Sei-Hwan Jung, Suwon-si (KR);
Ki-Yong Lee, Suwon-si (KR)

(73) Assignee: Samsung Display Co., Ltd., Yongin (KR)

( * ) Notice: Subject to any disclaimer, the term of this patent is extended or adjusted under 35 U.S.C. 154(b) by 425 days.

(21) Appl. No.: 12/045,172

(22) Filed: Mar. 10, 2008

(65) Prior Publication Data
US 2008/0217620 A1    Sep. 11, 2008

(30) Foreign Application Priority Data
Mar. 9, 2007  (KR) ........................ 10-2007-0023628

(51) Int. Cl.
*H01L 29/10*    (2006.01)

(52) U.S. Cl.
USPC .................. 257/66; 257/57; 257/59; 257/69; 257/E29.049; 257/E29.053; 257/E29.054; 438/142; 438/149; 438/151; 438/166

(58) Field of Classification Search
USPC .......... 257/59, E33.001, 57, 66, 69, E27.049, 257/E29.053, E29.054, E29.049; 438/151, 438/149, 142, 166
See application file for complete search history.

(56) References Cited

U.S. PATENT DOCUMENTS

| | | | |
|---|---|---|---|
| 4,809,056 A * | 2/1989 | Shirato et al. .................. 257/347 |
| 4,906,587 A | 3/1990 | Blake | |
| 5,210,438 A * | 5/1993 | Nakamura ..................... 257/536 |
| 5,536,950 A | 7/1996 | Liu et al. | |
| 5,821,562 A | 10/1998 | Makita et al. | |
| 5,913,113 A | 6/1999 | Seo | |
| 6,124,613 A * | 9/2000 | Kokubun ....................... 257/347 |
| 6,160,268 A | 12/2000 | Yamazaki | |
| 6,166,786 A | 12/2000 | Ohkubo et al. | |

(Continued)

FOREIGN PATENT DOCUMENTS

| | | |
|---|---|---|
| EP | 0 816 903 A1 | 1/1998 |
| JP | 10-125908 | 5/1998 |

(Continued)

OTHER PUBLICATIONS

Notice of Allowability issued in Korean Patent Application No. 2007-23628 on Oct. 13, 2008 stated the references above.

(Continued)

*Primary Examiner* — Kenneth Parker
*Assistant Examiner* — John Lin
(74) *Attorney, Agent, or Firm* — H.C. Park & Associates, PLC

(57) ABSTRACT

A thin film transistor includes: a substrate; a semiconductor layer disposed on the substrate, and including a channel region, source and drain regions, and edge regions having a first impurity formed at edges of the source and drain regions, and optionally, in the channel region; a gate insulating layer insulating the semiconductor layer; a gate electrode insulated from the semiconductor layer by the gate insulating layer; and source and drain electrodes electrically connected to the semiconductor layer.

9 Claims, 9 Drawing Sheets

(56) References Cited

U.S. PATENT DOCUMENTS

| | | | |
|---|---|---|---|
| 6,475,835 | B1 | 11/2002 | Hu et al. |
| 6,653,700 | B2 | 11/2003 | Chau et al. |
| 6,661,180 | B2 * | 12/2003 | Koyama ................... 315/169.3 |
| 6,727,122 | B2 | 4/2004 | Seo et al. |
| 6,924,874 | B2 | 8/2005 | Lin et al. |
| 7,038,276 | B2 | 5/2006 | Ker et al. |
| 7,064,388 | B2 | 6/2006 | Hayakawa et al. |
| 7,274,037 | B2 | 9/2007 | Choi et al. |
| 7,276,730 | B2 | 10/2007 | Yamazaki et al. |
| 7,450,100 | B2 | 11/2008 | Koo |
| 7,763,889 | B2 | 7/2010 | Park |
| 2002/0066901 | A1 | 6/2002 | Yamanaka et al. |
| 2002/0153569 | A1 | 10/2002 | Katayama |
| 2002/0192884 | A1 * | 12/2002 | Chang et al. .................. 438/164 |
| 2004/0206956 | A1 | 10/2004 | Yanai et al. |
| 2006/0063315 | A1 | 3/2006 | Shin |
| 2007/0045740 | A1 * | 3/2007 | Park .............................. 257/347 |

FOREIGN PATENT DOCUMENTS

| | | |
|---|---|---|
| JP | 11-54759 | 2/1999 |
| JP | 11-214696 | 8/1999 |
| JP | 2003-7719 | 1/2003 |
| JP | 2003-100902 | 4/2003 |
| JP | 2003-152184 | 5/2003 |
| JP | 2003-174172 | 6/2003 |
| KR | 1996-30429 | 8/1996 |
| KR | 2003-3043 | 1/2003 |
| KR | 2003-3043 A | 1/2003 |
| KR | 2003-69852 | 8/2003 |
| KR | 2003-69852 A | 8/2003 |
| KR | 2004-92916 | 11/2004 |
| KR | 2005-18530 | 2/2005 |
| KR | 2005-69594 | 7/2005 |
| KR | 2006-12089 | 2/2006 |
| KR | 2007-24016 | 3/2007 |

OTHER PUBLICATIONS

Office Action issued by Korean Intellectual Property Office in Korean Patent Application No. 2007-23628 on Jan. 25, 2008.
Notice of Reexamination issued by Chinese Intellectual Property Office in Chinese Patent Application No. 200410042055.5 on Mar. 12, 2009.
U.S. Appl. No. 10/827,326, filed Apr. 20, 2004, Byoung-Deog Choi, Samsung Electronics Co., Ltd.
U.S. Appl. No. 10/938,000, filed Sep. 10, 2004, Jae-Bon Koo, Samsung Electronics Co., Ltd.
U.S. Appl. No. 11/513,052, filed Aug. 24, 2006, Byoung-Keong Park, Samsung Electronics Co., Ltd.
U.S. Appl. No. 11/760,864, filed Jun. 11, 2007, Byoung-Deog Choi, Samsung Electronics Co., Ltd.
U.S. Appl. No. 11/760,869, filed Jun. 11, 2007, Byoung-Deog Choi, Samsung Electronics Co., Ltd.
U.S. Appl. No. 11/760,876, filed Jun. 11, 2007, Byoung-Deog Choi, Samsung Electronics Co., Ltd.
Office Action issued in U.S. Appl. No. 11/510,052 on Jan. 4, 2008.
Office Action issued in U.S. Appl. No. 11/510,052 on Oct. 28, 2008.
Office Action issued in U.S. Appl. No. 11/510,052 on Apr. 17, 2009.
Office Action issued in U.S. Appl. No. 11/760,864 on Jul. 16, 2009.
US Office Action dated Sep. 30, 2010, issued in corresponding U.S. Appl. No. 11/760,864.
US Office Action dated May 3, 2010, issued in corresponding U.S. Appl. No. 11/760,864.
US Office Action dated Jan. 22, 2010, issued in corresponding U.S. Appl. No. 11/760,864.
US Office Action dated Jul. 16, 2009, issued in corresponding U.S. Appl. No. 11/760,864.
US Office Action dated Apr. 21, 2009, issued in corresponding U.S. Appl. No. 11/760,864.
US Office Action dated Feb. 10, 2009, issued in corresponding U.S. Appl. No. 11/760,864.
US Office Action dated Sep. 8, 2008 issued in corresponding U.S. Appl. No. 11/760,864.
US Office Action dated Jun. 27, 2008, issued in corresponding U.S. Appl. No. 11/760,864.
US Office Action dated Mar. 20, 2008, issued in corresponding U.S. Appl. No. 11/760,864.
US Office Action dated Sep. 28, 2007, issued in corresponding U.S. Appl. No. 11/760,864.
US Office Action dated Sep. 30, 2010, issued in corresponding U.S. Appl. No. 11/760,869.
US Office Action dated Jun. 18, 2010, issued in corresponding U.S. Appl. No. 11/760,869.
US Office Action dated Apr. 9, 2010, issued in corresponding U.S. Appl. No. 11/760,869.
US Office Action dated Nov. 9, 2009, issued in corresponding U.S. Appl. No. 11/760,869.
US Office Action dated May 5, 2009, issued in corresponding U.S. Appl. No. 11/760,869.
US Office Action dated Jan. 28, 2009, issued in corresponding U.S. Appl. No. 11/760,869.
US Office Action dated Aug. 27, 2008, issued in corresponding U.S. Appl. No. 11/760,869.
US Office Action dated Jun. 18, 2008, issued in corresponding U.S. Appl. No. 11/760,869.
US Office Action dated Mar. 11, 2008, issued in corresponding U.S. Appl. No. 11/760,869.
US Office Action dated Sep. 28, 2007, issued in corresponding U.S. Appl. No. 11/760,869.
US Office Action dated Sep. 30, 2010, issued in corresponding U.S. Appl. No. 11/760,876.
US Office Action dated May 5, 2010, issued in corresponding U.S. Appl. No. 11/760,876.
US Office Action dated Feb. 23, 2010, issued in corresponding U.S. Appl. No. 11/760,876.
US Office Action dated Aug. 20, 2009, issued in corresponding U.S. Appl. No. 11/760,876.
US Office Action dated May 5, 2009, issued in corresponding U.S. Appl. No. 11/760,876.
US Office Action dated Jan. 28, 2009, issued in corresponding U.S. Appl. No. 11/760,876.
US Office Action dated Sep. 8, 2008, issued in corresponding U.S. Appl. No. 11/760,876.
US Office Action dated Jun. 27, 2008, issued in corresponding U.S. Appl. No. 11/760,876.
US Office Action dated Mar. 20, 2008, issued in corresponding U.S. Appl. No. 11/760,876.
US Office Action dated Oct. 11, 2007, issued in corresponding U.S. Appl. No. 11/760,876.
U.S. Appl. No. 12/889,826, filed Sep. 24, 2010, Byoung-Keon Park et al., Samsung Mobile Display Co., Ltd.
Office Action dated Oct. 2, 2009 for related U.S. Appl. No. 11/510,052 listing cited reference 5,913,113 previously cited in an Information Disclosure Statement dated Jun. 18, 2009.
Non-Final Office Action of U.S. Appl. No. 12/889,826 dated May 24, 2012.
Non-Final Office Action dated Oct. 26, 2012 issued for U.S. Appl. No. 12/889,826.
Notice of Allowance issued on May 1, 2013 in U.S. Appl. No. 12/889,826.
Final Office Action of U.S. Appl. No. 12/889,826 dated Feb. 1, 2013.

* cited by examiner

THIN FILM TRANSISTOR, METHOD OF FABRICATING THE SAME, AND ORGANIC LIGHT EMITTING DIODE DISPLAY DEVICE INCLUDING THE SAME

CROSS-REFERENCE TO RELATED APPLICATIONS

This application claims the benefit of Korean Application No. 2007-23628, filed Mar. 9, 2007, the disclosure of which is hereby incorporated herein by reference.

BACKGROUND OF THE INVENTION

1. Field of the Invention

Aspects of the present invention relate to a thin film transistor, a method of fabricating the same, and an organic light emitting diode (OLED) display device including the same. More particularly, aspects of the present invention relate to a thin film transistor that can prevent leakage current by removing crystallization inducing metals from a channel region of a semiconductor layer, reduce an edge effect by automatically forming source-body contact and eliminating a kink effect, a method of fabricating the same, and an OLED display device including the same.

2. Description of the Related Art

Flat panel display devices, such as, for example, liquid crystal display (LCD) devices, OLED display devices and plasma display panels (PDP), have been receiving a lot of attention, since such devices overcome disadvantages (such as heavy weight and large size) of conventional display devices such as cathode ray tubes.

OLED display devices have advantages over LCDs and PDPs. Since LCDs are passive devices and not self-emissive devices, there are limits to their brightness, contrast, viewing angles, large size, and so on. While PDPs are self-emissive devices, they are heavier, consume more power, and are more complicated to make than other flat panel displays. By contrast, since OLED display devices are self-emissive devices, they have an excellent viewing angle and contrast. Also, since OLED display devices do not need a backlight, they can be made thin and lightweight, and consume less power.

Moreover, OLED display devices have advantages such as being driven by direct current at low voltage, a fast response time, durability against external impact because they are formed entirely of solids, wide operating temperatures, and being manufactured by simple and economical methods.

Flat panel display devices such as OLED display devices or LCD devices use a thin film transistor as a switching device or a driving device.

FIG. 1A is a plan view of a conventional thin film transistor, and FIG. 1B is a cross-sectional view taken along line I-I of FIG. 1A. Referring to FIGS. 1A and 1B, in the conventional thin film transistor, a buffer layer 101 is disposed on a substrate 100, which is formed of glass or plastic, and a semiconductor layer 102, including source and drain regions 102a doped with impurities and a channel region 102b interposed therebetween, is disposed on the buffer layer 101.

In addition, a gate insulating layer 104 is disposed on the semiconductor layer 102, a gate electrode 105 is disposed to correspond to the channel region 102b of the semiconductor layer 102 on the gate insulating layer 104, and an interlayer insulating layer 107 is disposed on the gate electrode 105. Contact holes 108 exposing a predetermined region of the semiconductor layer 102 are formed, and source and drain electrodes 109 filling the contact holes 108 and electrically connected to the predetermined regions of the semiconductor layer 102 are disposed on the interlayer insulating layer 107.

Although it is desirable to remove elements from a thin film transistor that suppress its characteristics such as an edge effect to serve as a driving device for the flat panel display device, it may be difficult to solve these problems structurally in a conventional thin film transistor.

Moreover, a method of crystallizing an amorphous silicon layer into a polycrystalline silicon layer using a crystallization inducing metal, such as a metal induced crystallization (MIC) method or metal induced lateral crystallization (MILC) method, causes the thin film transistor to be subject to a leakage current because of the remaining crystallization inducing metals on the semiconductor layer.

SUMMARY OF THE INVENTION

Aspects of the present invention provide a thin film transistor in which a leakage current is prevented by forming an edge region in a predetermined region of a semiconductor layer, doping phosphorous (P) into the edge region and annealing the resultant structure so as to remove a crystallization inducing metal remaining in a channel region of the semiconductor layer. Aspects of the present invention further include a method of fabricating the same, and an organic light emitting diode (OLED) display device including the same.

Aspects of the present invention also provide a thin film transistor in which an edge effect and a kink effect are reduced by forming a source-body contact. Aspects of the present invention further include a method of fabricating the same, and an OLED display device including the same.

According to an embodiment of the present invention, a thin film transistor includes: a substrate; a semiconductor layer disposed on the substrate, and including a channel region, source and drain regions, and edge regions, wherein the edge regions are disposed at edges of the source and drain regions and have a first impurity; a gate insulating layer insulating the semiconductor layer; a gate electrode insulated from the semiconductor layer by the gate insulating layer; and source and drain electrodes electrically connected to the semiconductor layer.

According to another embodiment of the present invention, a method of removing a crystallization inducing metal from a semiconductor layer crystallized using the crystallization inducing metal to induce crystallization includes doping a phosphorous-containing impurity into an edge region of the semiconductor layer; annealing the semiconductor layer, whereby the phosphorous-containing impurity effects the removal of the crystallization inducing metal from the semiconductor layer.

In another embodiment of the present invention, a method of fabricating a thin film transistor includes: preparing a substrate; forming an amorphous silicon layer on the substrate; crystallizing the amorphous silicon layer into a polycrystalline silicon layer using a crystallization inducing metal; forming a semiconductor layer by patterning the polycrystalline silicon layer; forming a gate insulating layer on the semiconductor layer; forming a photoresist pattern exposing an edge region of the semiconductor layer on the substrate having the gate insulating layer, and doping a first impurity into the edge region; forming a gate electrode after removing the photoresist pattern; forming source and drain regions and a channel region by doping a second impurity into the semiconductor layer using the gate electrode as a mask; annealing the substrate to remove the crystallization inducing metal remaining in the channel region of the semiconductor layer; forming an interlayer insulating layer on the gate electrode; etching the interlayer insulating layer and the gate insulating layer to form a first contact hole exposing the source region and a portion of the edge region adjoining the source region and a second contact hole exposing the drain region and a portion of the edge region adjoining the drain region; and forming a source electrode in the interlayer insulating layer and the first contact hole electrically connected to the source region and the portion of the edge region adjoining the source region and forming a drain electrode in the interlayer insulating layer and second contact hole electrically connected to the drain region and the portion of the edge region adjoining the drain region.

In still another embodiment of the present invention, an organic light emitting diode (OLED) display device includes: a substrate; a semiconductor layer disposed on the substrate, and including a channel region, source and drain regions, and edge regions, wherein the edge regions are disposed at edges of the source and drain regions and have a first impurity; a gate insulating layer insulating the semiconductor layer; a gate electrode insulated from the semiconductor layer by the gate insulating layer; source and drain electrodes electrically connected to the semiconductor layer; a first electrode electrically connected to one of the source and drain electrodes; and an organic layer and a second electrode disposed on the first electrode.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1A:
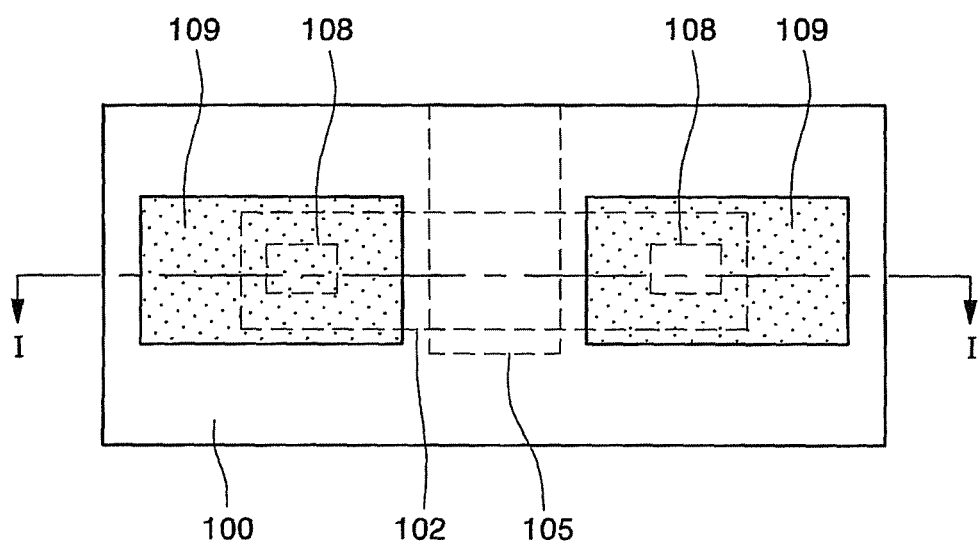
FIG. 1A is a plan view of a conventional thin film transistor.
Figure 1B:
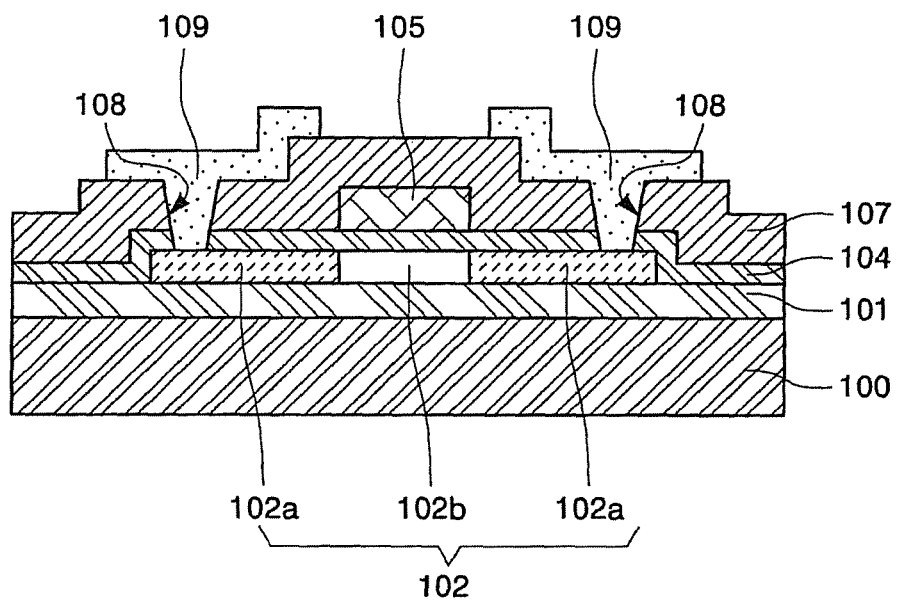
FIG. 1B is a cross-sectional view taken along line I-I of FIG. 1A.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Herein, it is to be understood that where is stated herein that one layer is "formed on" or "disposed on" a second layer, the first layer may be formed or disposed directly on the second layer or there may be intervening layers between the first layer and the second layer. Further, when used herein to describe a structure, device or apparatus, the term "formed on" is used with the same meaning as "located on" or "disposed on" and is not meant to be limiting regarding any particular fabrication process.

Figure 2A:
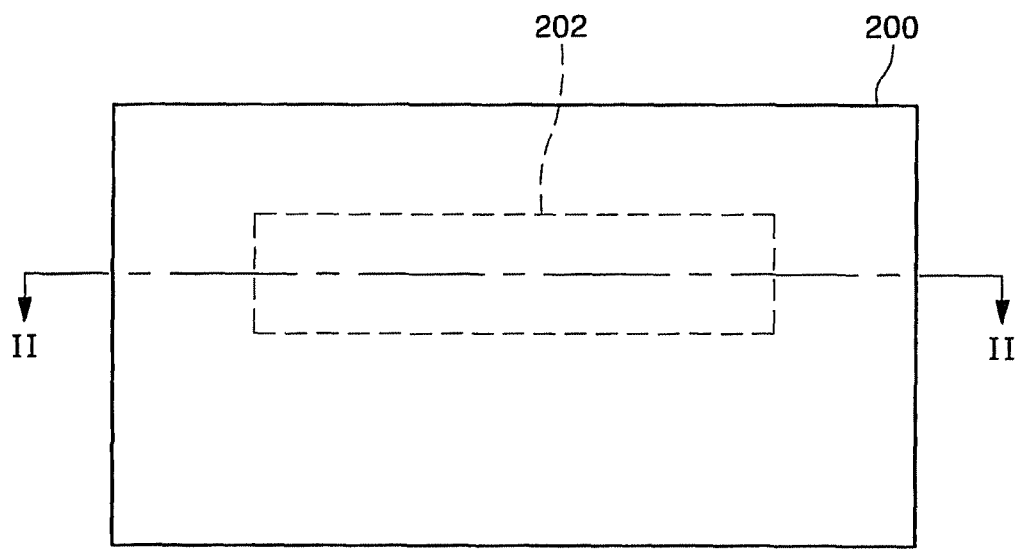
FIGS. 2A, 3A, 4A, 6A and 7A are plan views illustrating a fabrication process of a thin film transistor according to an embodiment of the present invention.
Figure 2B:
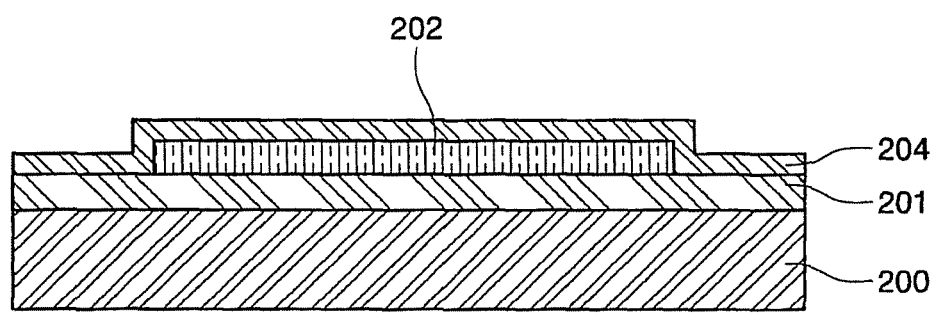
FIG. 2B is a cross-sectional view taken along line II-II of FIG. 2A.

FIG. 2A is a plan view illustrating a fabrication process of a thin film transistor according to an embodiment of the present invention, and FIG. 2B is a cross-sectional view taken along line II-II of FIG. 2A.

Referring to FIGS. 2A and 2B, a substrate 200 formed of glass or plastic is provided. A buffer layer 201 is formed on the substrate 200 to prevent the diffusion of moisture or impurities from the underlying substrate 200 or to control a heat transfer rate during a crystallization process of amorphous silicon into polysilicon described later.

An amorphous silicon layer (not illustrated) is formed on the buffer layer 201. The amorphous silicon layer may be formed by chemical vapor deposition (CVD) or physical vapor deposition (PVD). The amorphous silicon layer may be dehydrogenated to lower its hydrogen concentration during or after the forming of the amorphous silicon layer.

A semiconductor layer 202 is formed by crystallizing the amorphous silicon layer into a polycrystalline silicon layer. According to aspects of the present invention, the amorphous silicon layer is crystallized into the polycrystalline silicon layer by methods such as metal induced crystallization (MIC), metal induced lateral crystallization (MILC) or super grained silicon (SGS), which use a crystallization inducing metal. Phosphorous (P) is injected into an edge region of the semiconductor layer to be formed in the subsequent process to remove the crystallization inducing metal remaining in the channel region.

MIC is a method of phase-converting an amorphous silicon layer into a polycrystalline silicon layer by contacting a crystallization inducing metal such as nickel (Ni), palladium (Pd) or aluminum (Al) with the amorphous silicon layer or by injecting the crystallization inducing metal into the amorphous silicon layer. MILC is a method by which silicide formed by a reaction of a crystallization inducing metal with silicon is laterally propagated, thereby inducing sequential crystallization of the silicon. SGS is a method of crystallizing an amorphous silicon layer into a polycrystalline silicon layer having big-sized grains by forming a capping layer of silicon oxide, silicon nitride or combinations thereof on the amorphous silicon layer in order to control diffusion or infiltration of a crystallization inducing metal, forming a crystallization inducing metal layer on the capping layer and annealing the resultant structure. Annealing causes the crystallization inducing metal to diffuse onto the surface of the amorphous silicon layer after passing through the capping layer. The diffused crystallization inducing metal then induces the amorphous silicon layer to be crystallized into the polycrystalline silicon layer. That is, the crystallization inducing metal of the crystallization inducing metal layer is combined with silicon of the amorphous silicon layer, thereby forming metal silicide, which functions as a seed, i.e., a core of the crystallization, to induce the crystallization of the amorphous silicon layer. Accordingly, by controlling the amount of the metal silicide that is formed, the grain size in the polycrystalline silicon layer may be controlled. Also, since the grain size of the polycrystalline silicon layer is determined by the concentration of the crystallization inducing metal contributing to the crystallization, the grain size of the polycrystalline silicon layer may be controlled by controlling the diffusion prevention ability of the capping layer. The crystallization inducing metal may be at least one selected from the group consisting of Ni, Pd, Ti, Ag, Au, Al, Sn, Sb, Cu, Co, Mo, Tr, Ru, Rh, Cd and Pt. For example, the crystallization inducing metal may be Ni. The crystallization inducing metal is formed at a surface density of approximately $5*e^{12}/cm^2$. The annealing process is performed at a temperature in a range of 400 to 1300° C., by any suitable heating process such as, for example, a furnace process, an RTA process, a UV process or a laser process.

After the polycrystalline silicon layer is patterned to form the semiconductor layer 202 by one of the crystallization methods described above, the crystallization inducing metal remains in the semiconductor layer 202. Also, the semiconductor layer 202 includes regions in which source and drain regions, a channel region and edge regions are formed.

Then, a gate insulating layer 204 is formed on the substrate having the semiconductor layer 202. The gate insulating layer 204 may be formed of silicon oxide, silicon nitride or combinations thereof.

Figure 3A:
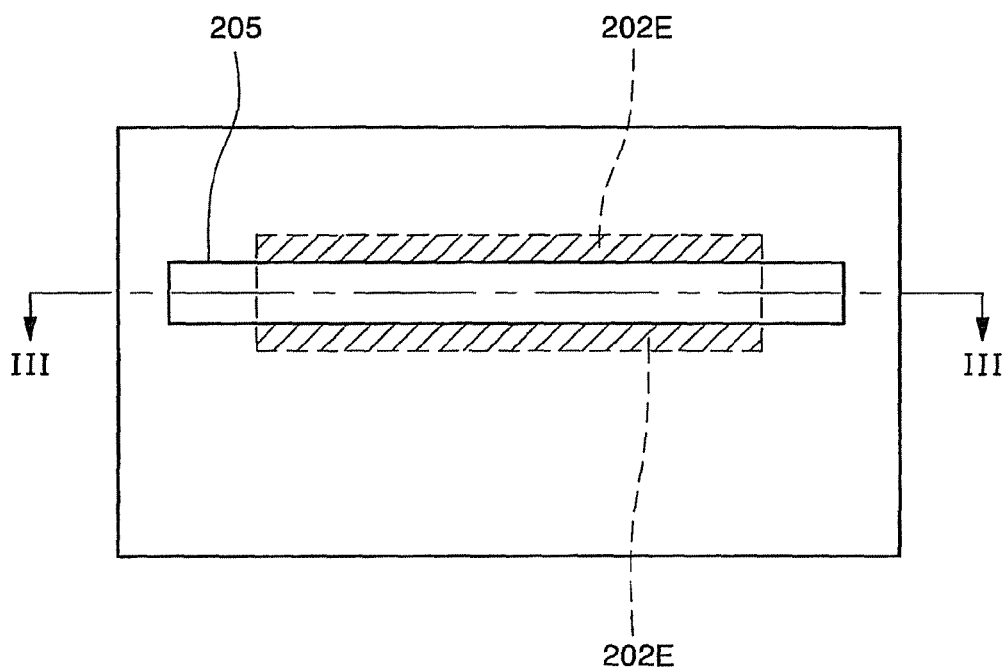
Figure 3B:
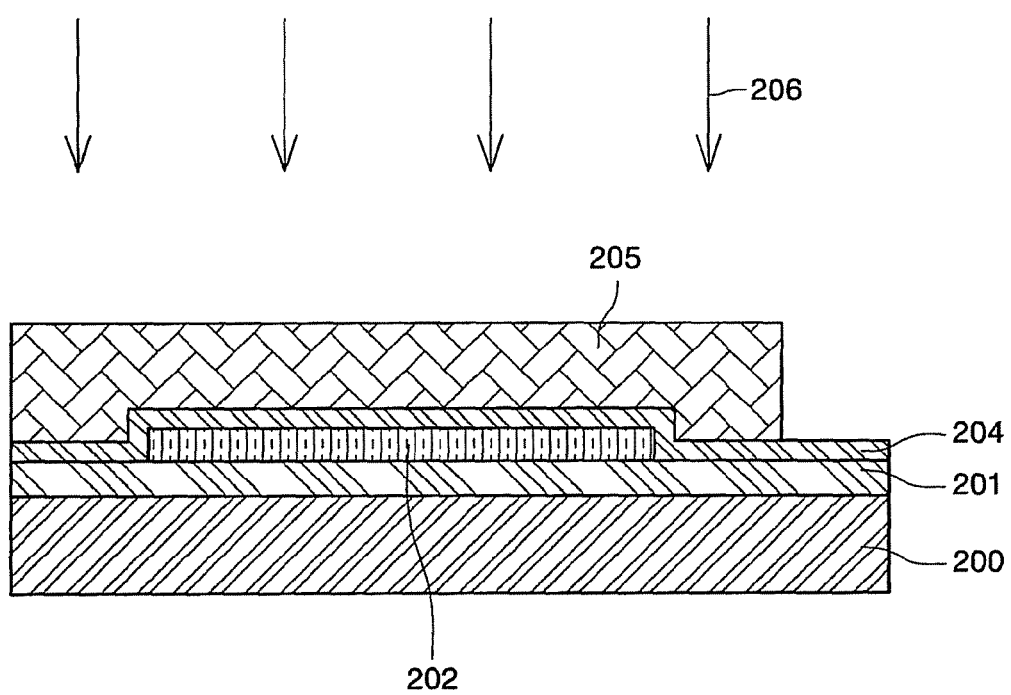
FIG. 3B is a cross-sectional view taken along line III-III of FIG. 3A.

FIG. 3A is a plan view further illustrating the fabrication process of a thin film transistor according to the embodiment of the present invention, and FIG. 3B is a cross-sectional view taken along line III-III of FIG. 3A.

Referring to FIGS. 3A and 3B, a photoresist is coated on the substrate 200 having the gate insulating layer 204, and a photoresist pattern 205 that exposes an edge region 202E of the semiconductor layer 202 is formed by exposure. The edge region 202E is formed along a length direction of the semiconductor layer 202 in a region outside of the semiconductor layer 202.

Then, a first impurity 206 is doped into the edge region 202E of the semiconductor layer 202 using the photoresist pattern 205 as a mask. The first impurity 206 is doped to remove the crystallization inducing metal remaining particularly in a channel region of the semiconductor layer.

Subsequently, the substrate 200 is annealed at 450 to 900° C. for a duration of 30 seconds up to 10 hours to effect the removal of the crystallization metal from the semiconductor layer 202. If the annealing temperature is less than 450° C., sufficiently removing the crystallization inducing metal (Ni, etc.) from the semiconductor layer 202 may be difficult. If the annealing temperature is over 900° C., the substrate 200 may be deformed due to high temperature. Moreover, if the annealing time is under 30 seconds, sufficiently removing the crystallization inducing metal (Ni, etc.) from the semiconductor layer 202 may be difficult. If the annealing time is over 10 hours, the substrate 200 may be deformed due to the long heating time, production costs may be increased, and yield of the thin film transistor may be lowered.

Accordingly, the crystallization inducing metal remaining in the channel region of the semiconductor layer 202 may have a concentration of less than $1*e^{16}/cm^3$ after the removal by annealing, and thus the thin film transistor having excellent electrical characteristics may be formed.

The first impurity 206 may be P or $PH_x^+$ (herein, x=0, 1, 2, 3), or may be a fifth group element in the element periodic table when forming a PMOS transistor. For example, the first impurity 206 may be P. The first impurity is doped at a dose of $1*e^{11}/cm^3$ to $3*e^{15}/cm^3$. If the first impurity 206 is doped at a dose of less than $1*e^{11}/cm^3$, the crystallization inducing metal (Ni, etc.) remaining in the semiconductor layer 202 is not sufficiently removed due to insufficient P, and when the first impurity 206 is doped at a dose of more than $3*e^{15}/cm^3$, the resistance of the semiconductor layer 202 is increased. Since P has a high atomic weight, the resistance is not decreased at a common annealing temperature as the doping dose is increased. This is because P is not well activated, and thus has electrical properties.

Generally, an edge region of the semiconductor layer is formed by forming a polycrystalline silicon layer on the entire surface of the substrate, forming a photoresist pattern on the polycrystalline silicon layer, and etching the polycrystalline silicon layer using the photoresist pattern as a mask. The edge region of the semiconductor layer may be damaged by an etch solution or plasma used in etching. Also, due to the remaining photoresist in the edge region, the characteristics of the semiconductor layer may become non-uniform or poor. Thus, characteristics such as a threshold voltage or an S-factor are changed, and humps are generated in an I-V curve showing the thin film transistor's characteristics. Such problems are caused by use of the damaged edge region as a channel region. Accordingly, these problems may be solved by doping the first impurity 206 into a predetermined region (specifically, a predetermined region adjacent to the channel region) at an edge of the semiconductor layer to form source and drain regions, a channel region formed therebetween and an edge region disposed at an outer side of the channel region, thereby flowing a current only in the channel region.

Figure 4A:
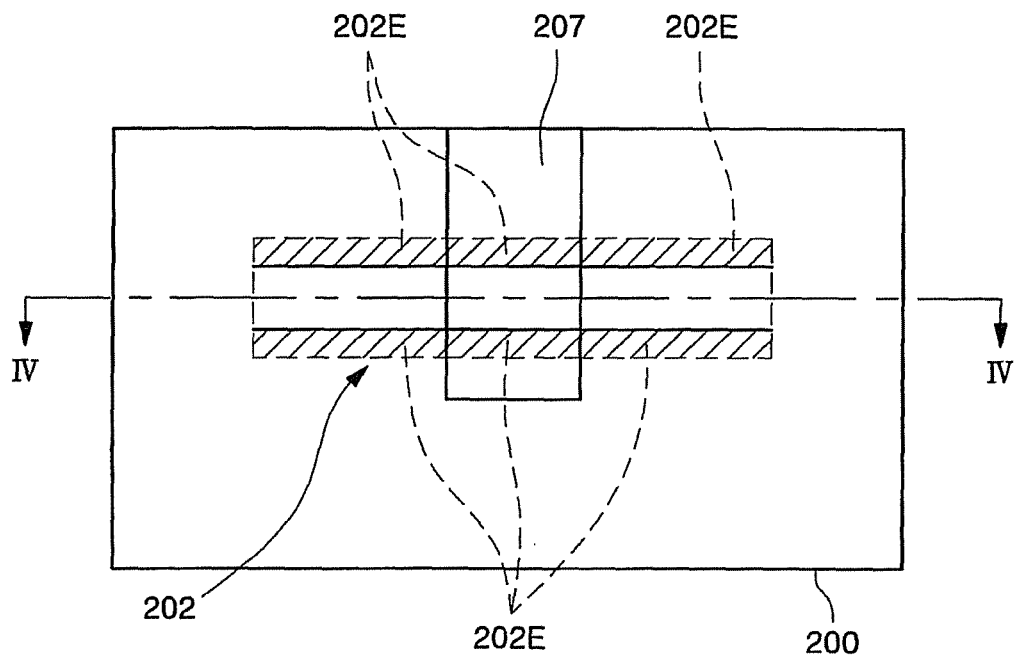
Figure 4B:
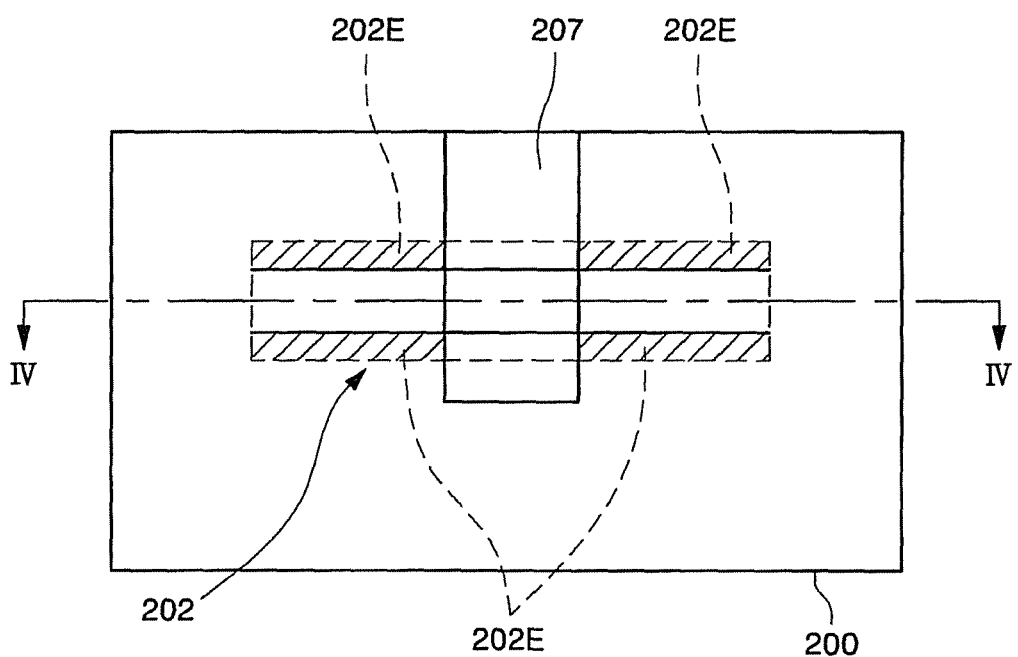
FIG. 4B is plan views further illustrating the fabrication process of a thin film transistor according to another embodiment of the present invention.
Figure 4C:
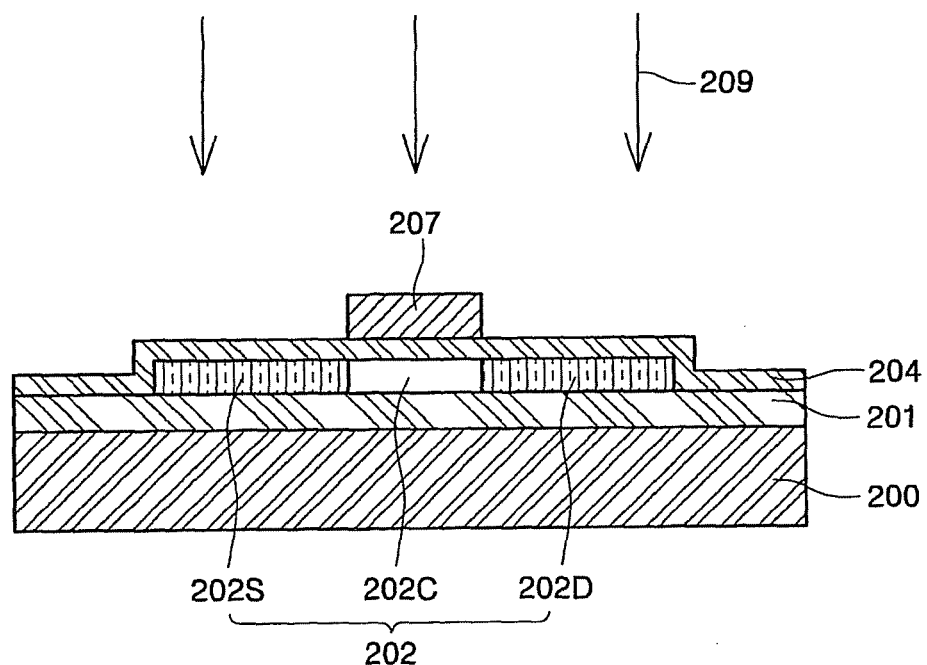
FIG. 4C is a cross-sectional view taken along line IV-IV of FIG. 4A.

FIGS. 4A and 4B are plan views further illustrating the fabrication process of a thin film transistor according to the embodiment of the present invention, and FIG. 4C is a cross-sectional view taken along line IV-IV of FIG. 4A.

Referring to FIGS. 4A to 4C, the photoresist pattern 205 of FIGS. 3A and 3B is removed, and a gate electrode 207 is formed on the gate insulating layer 204. The gate electrode 207 is formed on a predetermined region corresponding to the semiconductor layer 202 by forming a metal layer, such as, for example, a single layer of aluminum (Al) or an Al alloy such as aluminum-neodymium (Al—Nd), or in a multiple layer having an Al alloy on a chromium (Cr) or Molybdenum (Mo) alloy, and etching the metal layer using photolithography and etching.

The gate electrode 207 is formed at a position corresponding to the semiconductor layer 202, thereby defining a channel region 202C and source and drain regions 202S and 202D in the semiconductor layer 202.

While the first impurity 206 is doped after forming the photoresist pattern 205 exposing the edge region 202E of the semiconductor layer 202, i.e., the edge region of the channel region and the source and drain regions in FIG. 3A, in another embodiment as illustrated in FIG. 4B, the first impurity 206 may be doped into the edge region of only the source and drain regions 202S and 202D, and not into an edge region of the channel region 202C, using the gate electrode 207 as a mask after forming the gate electrode 207.

Then, a second impurity 209, which can be a p-type impurity or n-type impurity, is doped using the gate electrode 207 as a mask to form the source regions 202S and the drain regions 202D. The second impurity 209 is a different type impurity from the first impurity 206. The p-type impurity may be selected from the group consisting of boron (B), aluminum (Al), gallium (Ga) and indium (In), and the n-type impurity may be selected from the group consisting of phosphorous (P), antimony (Sb) and arsenic (As). As a specific, non-limiting example, the second impurity 209 may comprise B which may be in the form of $B_2H_x^+$, $BH_x^+$ (herein, x=0, 1, 2, 3 . . . 6), or may comprise a third group element in the element periodic table.

Figure 5:
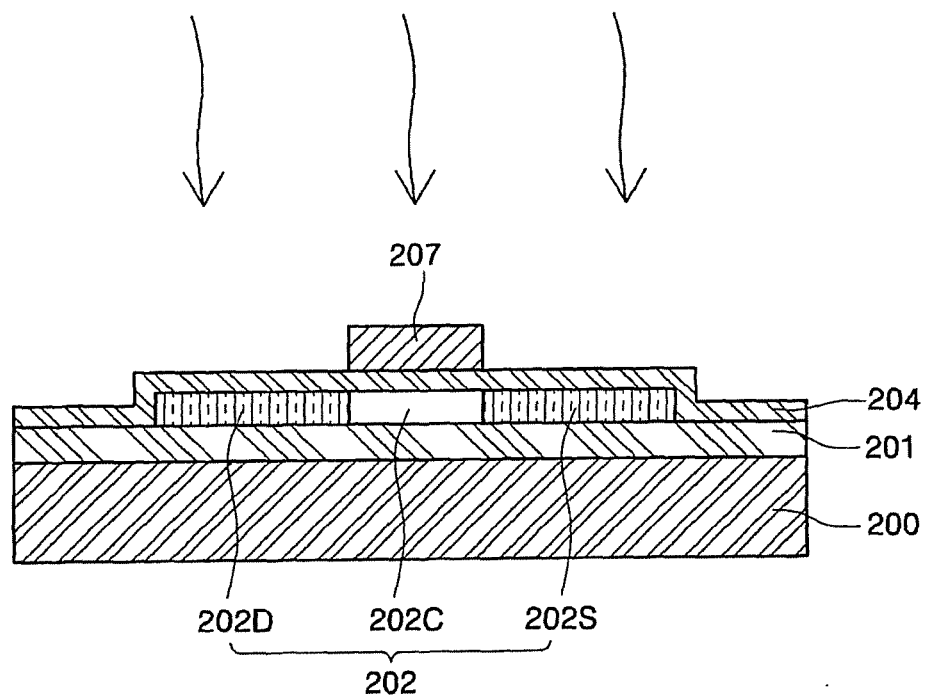
FIG. 5 is a cross-sectional view illustrating a process to remove crystallization inducing metals remaining in a semiconductor layer by annealing a substrate.

FIG. 5 is a cross-sectional view illustrating the process to remove the crystallization inducing metal remaining in the semiconductor layer (specifically, the channel region of the semiconductor layer) by annealing the substrate.

Here, the annealing process to remove the crystallization inducing metal remaining in the semiconductor layer, as described above, may include a first annealing process performed right after doping the first impurity to remove the crystallization inducing metal, and a second annealing process performed after doping the second impurity to form the subsequent source and drain regions. Alternatively, the annealing process may be performed once after doping the first impurity and then doping the second impurity to remove the crystallization inducing metal remaining in the semiconductor layer and activate the second impurity in the source and drain regions.

Referring to FIG. 5, the annealing process is performed to remove the crystallization inducing metal (Ni, etc.) remaining in a semiconductor layer 202. The annealing process is performed at 450 to 900° C. for a duration of 30 seconds up to 10 hours.

If the annealing temperature is under 450° C., the crystallization inducing metal (Ni, etc.) may not be sufficiently removed from the semiconductor layer 202. If the annealing temperature is over 900° C., the substrate 200 may be deformed. Also, if the annealing time is under 30 seconds, the crystallization inducing metal (Ni, etc.) may not be sufficiently removed from the semiconductor layer 202. If the time is over 10 hours, deformation of the substrate 200, high production cost and low yield of the thin film transistor may occur.

Accordingly, the crystallization inducing metal remaining in the channel region of the semiconductor layer after the removal of the crystallization inducing metals may have a concentration of less than $1*e^{16}/cm^3$, and thus the thin film transistor having excellent electrical characteristics may be formed.

Figure 6A:
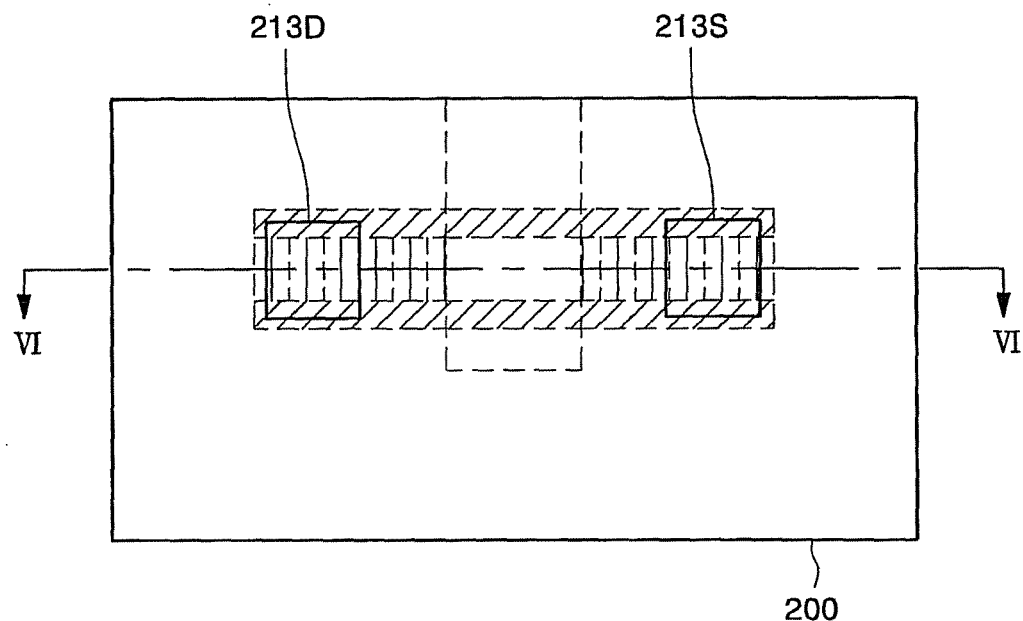
Figure 6B:
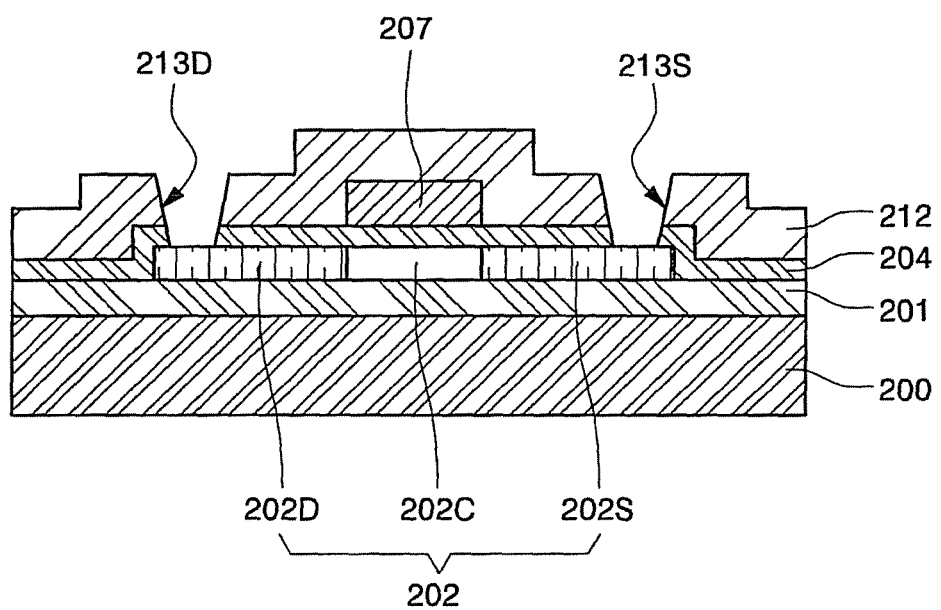
FIG. 6B is a cross-sectional view taken along VI-VI of FIG. 6A.

FIG. 6A is a plan view further illustrating the fabrication process of a thin film transistor according to the embodiment of the present invention, and FIG. 6B is a cross-sectional view taken along line VI-VI of FIG. 6A. Referring to FIGS. 6A and 6B, an interlayer insulating layer 212 protecting the underlying structure is formed on the structure shown in FIG. 5. Then, the interlayer insulating layer 212 and the gate insulating layer 204 are etched to form contact holes 213D and 213S exposing predetermined regions of the source and drain regions 202S and 202D and a predetermined region of the edge region 202E of the semiconductor layer 202.

Figure 7A:
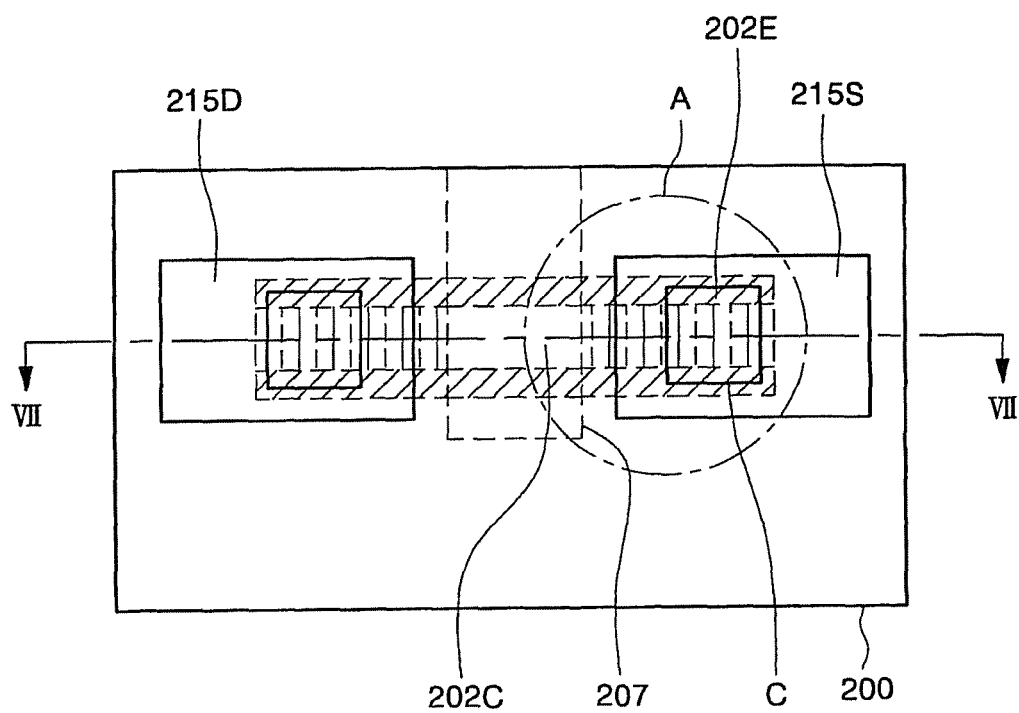
Figure 7B:
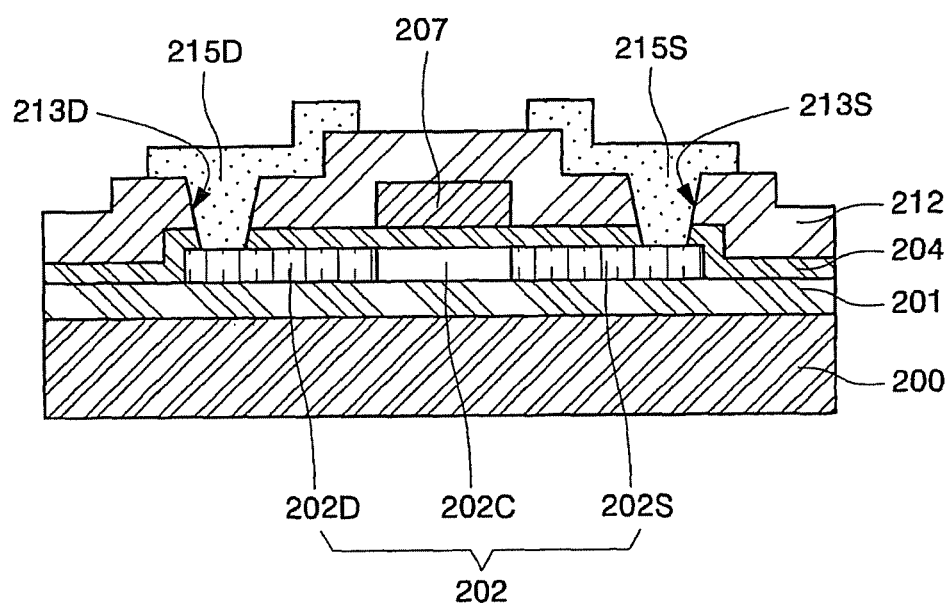
FIG. 7B is a cross-sectional view taken along VII-VII of FIG. 7A.

FIG. 7A is a plan view further illustrating the fabrication process of a thin film transistor according to the embodiment of the present invention, and FIG. 7B is a cross-sectional view taken along VII-VII of FIG. 7A.

Referring to FIGS. 7A and 7B, a conductive layer (not illustrated) is formed on the structure shown in FIGS. 6A and 6B, filling the contact holes 213D and 213S Subsequently, the conductive layer is patterned to form a source electrode 215S electrically connected to the source region 202S and the edge region 202E of the semiconductor layer 202 through the contact hole 213S, and a drain electrode 215D electrically connected to the drain region 202D of the semiconductor layer 202 through the contact hole 213D.

Figure 8:
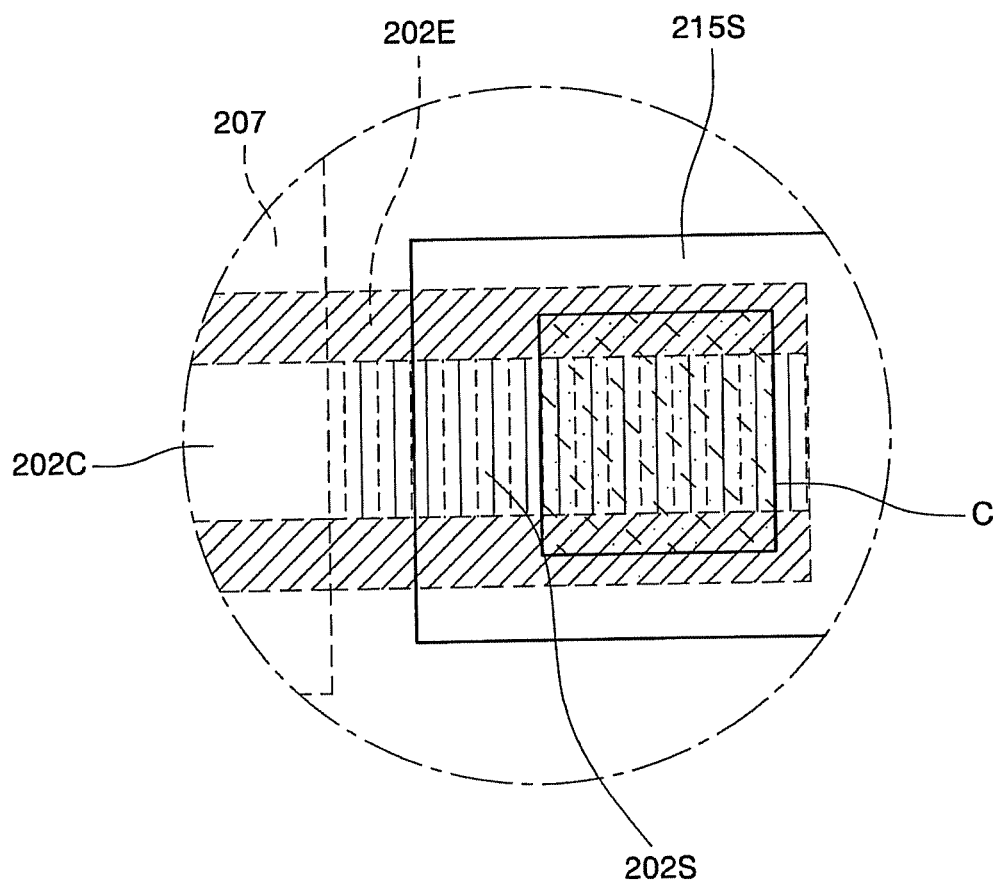
FIG. 8 is an enlarged plan view of region A of FIG. 7A.

FIG. 8 is an enlarged plan view of region A of FIG. 7A. While the source region 202S of the semiconductor layer 202 (in FIG. 7) is illustrated, it is to be understood that the drain region 202D has a similar structure. As noted above, the source electrode 215S is formed by depositing and patterning a conductive layer to fill the contact hole 213S. Also as noted above, the contact hole 213S was formed to simultaneously expose a predetermined region of the source region 202S and a predetermined region of the edge region 202E. A contact region C, in which the conductive layer is simultaneously in contact with the source region 202S and the edge region 202E, is formed over a predetermined region of the source region 202S and a predetermined region of the edge region 202E, thereby forming an interconnection in the source electrode 215S connecting the source region 202S to the edge region 202E. Since the edge region 202E is adjacent to the channel region 202C, the interconnection substantially functions to connect the channel region 202C to the source and drain regions 202S and 202D. Alternatively the edge region 202E can be formed as illustrated in FIG. 4B.

As thin film transistors are decreased in size due to increased resolution of the flat panel display devices, hot carriers are generated in the drain region adjacent to the channel region due to a lateral electric field (LEF) in the drain region at low drain voltage. Impact ionization and an increase of carriers, i.e., electron-hole pairs, occur due to the hot carriers, and avalanche multiplication, in which the carriers continuously move toward the channel region, occurs. Such avalanche multiplication causes problems of an abrupt increase in drain current due to a kink effect, alteration of threshold voltage and deterioration of the thin film transistor.

These problems may be considered as a bipolar junction transistor (BJT) effect, which may be solved according to aspects of the present invention by the forming of an interconnection electrically connecting the channel region 202C to the source region 202S through the edge region 202E of the semiconductor layer 202. That is, the electron-hole pairs generated in the channel region 202C and the drain region 202D due to the LEF effect may move toward the source region 202S through the edge region 202E and the interconnection, thereby completely eliminating the BJT effect in the drain region 202D.

Figure 9:
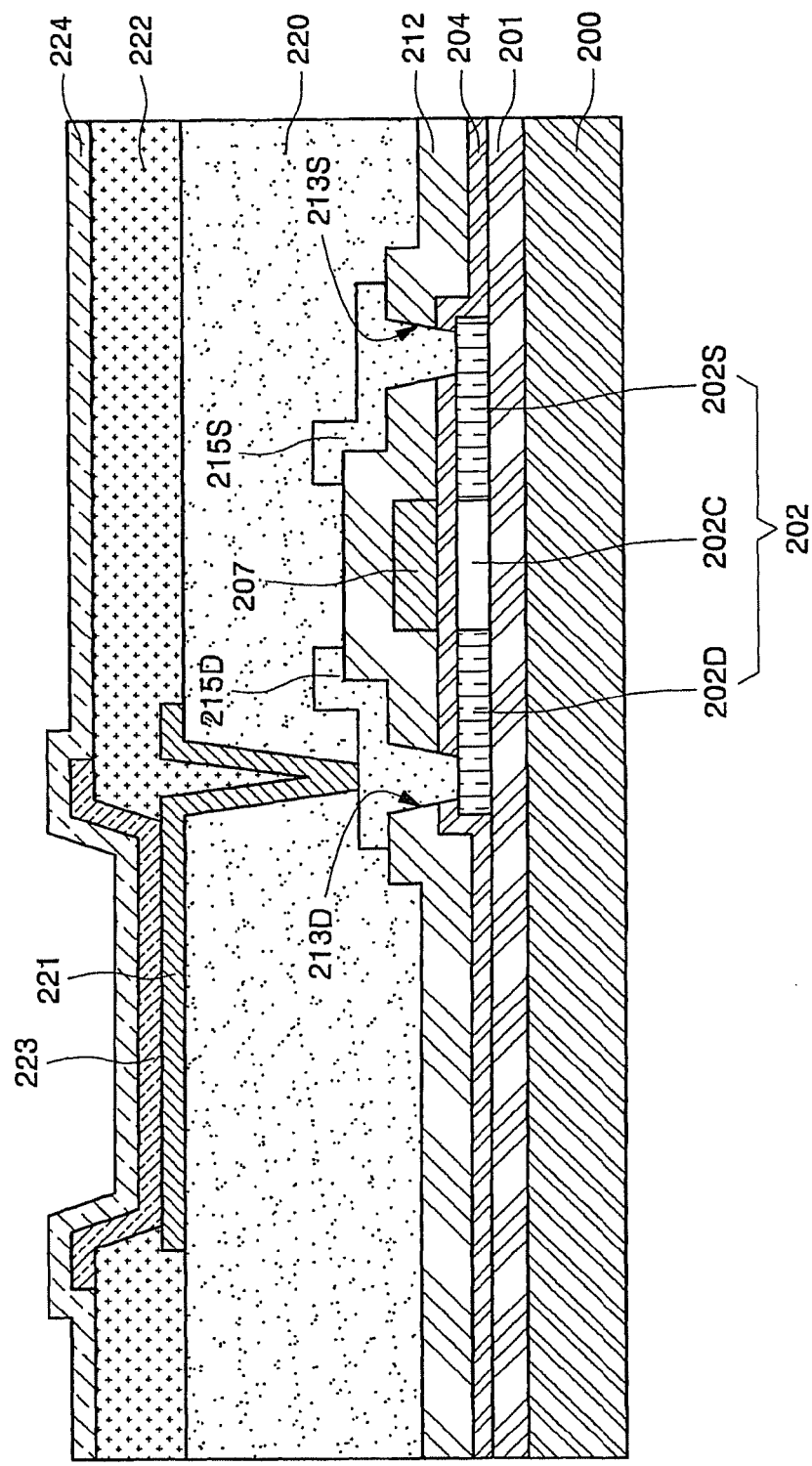
FIG. 9 is a cross-sectional view illustrating a fabrication method of an organic light emitting diode (OLED) display device according to another embodiment of the present invention.

FIG. 9 is a cross-sectional view of an OLED display device according to an embodiment of the present invention. Referring to FIG. 9, a planarization layer 220 is formed on the entire surface of the structure shown in FIGS. 7A and 7B. The planarization layer 220 may be an organic layer, an inorganic layer or a combination thereof. When the planarization layer 220 is an inorganic layer, the layer may be formed of spin on glass (SOG), and when the planarization layer 220 is an organic layer, the layer may be formed of an acryl series resin, a polyimide series resin or benzocyclobutene (BCB).

The planarization layer 220 is etched to form a via hole exposing either the source electrode 213S or the drain electrode 215D, and to form a first electrode 221 connected to the source electrode 215S or the drain electrode 215D. (FIG. 9 shows the first electrode 221 connected to the drain electrode 215D.) The first electrode 221 is in contact with the source electrode or the drain electrode by extending from the bottom of the via hole onto the planarization layer 220. The first electrode 221 may be formed of a single layer of indium tin oxide (ITO) or indium zinc oxide (IZO), or a double or triple layer thereof together with an Al or Ag alloy.

Subsequently, a pixel defining layer 222 is formed on the entire surface of the planarization layer 220 having the first electrode 221 to a sufficient thickness to completely fill the via hole in which the first electrode 221 is disposed. The pixel defining layer 222 may be an organic layer or an inorganic layer. For example, the pixel defining layer 222 may be an organic layer, formed, for example, of a material selected from the group consisting of BCB, an acryl series polymer and a polyimide. The pixel defining layer 222 may be evenly formed on the entire surface of the planarization layer 220 by using a material having an excellent flowability.

The pixel defining layer 222 is etched to form an opening exposing the first electrode 221, and an organic layer 223 is formed on the first electrode 221 exposed through the opening. The organic layer 223 includes at least an emitting layer, and may further include at least one of a hole injection layer, a hole transport layer, an electron transport layer and an electron injection layer.

Subsequently, a second electrode 224 is formed on the entire surface of the pixel defining layer 222 and organic layer 223. The second electrode 224 may be a transparent electrode formed of a material such as Mg, Ag, Al, Ca, or an alloy thereof that has a low work function.

Consequently, the OLED display device according to an embodiment of the present invention is completed.

According to aspects of the present invention as described above, crystallization inducing metals that would otherwise remain in a channel region of a semiconductor layer may be removed, thereby obtaining a thin film transistor that can prevent leakage current.

Also, according to the present invention, a source-body contact is formed, thereby reducing an edge effect and removing a kink effect.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A thin film transistor, comprising:
a substrate;
a semiconductor layer disposed on the substrate, and comprising a crystallization inducing metal, a channel region, source and drain regions respectively disposed on opposing first and second sides of the channel region, and edge regions that are doped with a first impurity and that extend continuously from the source region to the drain region, along opposing third and fourth sides of the channel region, and excluding center portions of the channel region, source region and drain region;
a gate insulating layer insulating the semiconductor layer;
a gate electrode insulated from the semiconductor layer by the gate insulating layer; and
source and drain electrodes electrically connected to the semiconductor layer,
wherein a first interconnection is formed through a first contact hole exposing the source region and a portion of the edge regions at edges of the source region,
wherein a second interconnection is formed through a second contact hole exposing the drain region and a portion of the edge regions at edges of the drain region, and
wherein the first impurity is doped at a dose of $1*e^{11}/cm^3$ to $3*e^{15}/cm^3$ to getter the crystallization inducing metal into the edge regions of the semiconductor layer.

2. The thin film transistor according to claim 1, wherein the first impurity comprises phosphorous (P).

3. The thin film transistor according to claim 1, wherein the first interconnection is the source electrode and the second interconnection is the drain electrode.

4. The thin film transistor according to claim 1, wherein the crystallization inducing metal comprises at least one selected from the group consisting of Ni, Pd, Ti, Ag, Au, Al, Sn, Sb, Cu, Co, Mo, Tr, Ru, Rh, Cd and Pt.

5. The thin film transistor according to claim 1, wherein the concentration of the crystallization inducing metal in the channel region of the semiconductor layer is less than $1*e^{16}/cm^3$.

6. An organic light emitting diode (OLED) display device, comprising:
a substrate;
a semiconductor layer disposed on the substrate, and comprising a crystallization inducing metal, a channel region, source and drain regions respectively disposed on opposing first and second sides of the channel, and edge regions that are doped with a first impurity and that extend continuously from the source region to the drain region, along opposing third and fourth sides of the channel region, and excluding center portions of the channel region, source region and drain region;
a gate insulating layer insulating the semiconductor layer;
a gate electrode insulated from the semiconductor layer by the gate insulating layer;
source and drain electrodes electrically connected to the semiconductor layer;
a first electrode electrically connected to one of the source and drain electrodes; and
an organic layer and a second electrode disposed on the first electrode,
wherein a first interconnection is formed through a first contact hole exposing the source region and a portion of the edge regions at edges of the source region,
wherein a second interconnection is formed through a second contact hole exposing the drain region and a portion of the edge regions at edges of the drain region, and
wherein the first impurity is doped at a dose of $1*e^{11}cm^3$ to $3*e^{15}/cm^3$ to getter the crystallization inducing metal into the edge regions of the semiconductor layer.

7. The OLED display device according to claim 6, wherein the first impurity comprises phosphorous (P).

8. The OLED display device according to claim 6, wherein the first interconnection is the source electrode and the second interconnection is the drain electrode.

9. The OLED display device according to claim 6, wherein the concentration of the crystallization inducing metal in the channel region of the semiconductor layer is less than $1*e^{16}/cm^3$.

* * * * *